United States Patent [19]

Bargon et al.

[11] 3,964,908

[45] June 22, 1976

[54] POSITIVE RESISTS CONTAINING DIMETHYLGLUTARIMIDE UNITS

[75] Inventors: Joachim Bargon, Los Gatos; Edward Gipstein, Saratoga; Hiroyuki Hiraoka, Los Gatos, all of Calif.

[73] Assignee: International Business Machines Corporation, Armonk, N.Y.

[22] Filed: Sept. 22, 1975

[21] Appl. No.: 615,652

[52] U.S. Cl. ............................ 96/35.1; 96/115 R; 204/159.11; 204/159.16; 427/43
[51] Int. Cl.[2] ...................... G03C 5/00; G03C 5/24
[58] Field of Search ............... 96/35.1, 36.2, 115 R; 427/44, 43; 204/159.11, 159.15, 159.16

[56] References Cited
UNITED STATES PATENTS

| | | | |
|---|---|---|---|
| 3,535,137 | 10/1970 | Haller et al. | 427/44 |
| 3,887,450 | 6/1975 | Gilano et al. | 204/159.15 |
| 3,898,350 | 8/1975 | Gipstein et al. | 96/35.1 X |
| 3,920,618 | 11/1975 | Ichimura et al. | 96/36.2 X |

FOREIGN PATENTS OR APPLICATIONS

| | | |
|---|---|---|
| 1,113,309 | 8/1961 | Germany |

OTHER PUBLICATIONS

Chem. Abst., vol. 56, Mar. 1962, p. 6186(d).
Chem. Abstracts, vol. 65, 1966, p. 10680(d).

*Primary Examiner*—Thomas J. Herbert, Jr.
*Attorney, Agent, or Firm*—Joseph G. Walsh

[57] ABSTRACT

A process for forming an image with a positive resist using a polymer containing dimethylglutarimide units. The polymer is sensitive to both electron beam and light radiation, has a high glass transition temperature, a high temperature resistance, and is capable of very fine spatial resolution, very suitable for micro circuitry processings.

10 Claims, No Drawings

POSITIVE RESISTS CONTAINING DIMETHYLGLUTARIMIDE UNITS

FIELD OF THE INVENTION

The present invention is concerned with a process for forming an image by means of a positive resist. In particular, it is concerned with polymers suitable for use in such a process. The polymers are those containing dimethylglutarimide units.

PRIOR ART

Positive acting polymeric resists are well known in the prior art. Such prior art is thoroughly discussed in, for example, U.S. Pat. No. 3,535,137 of Haller et al. That patent provides a very good discussion of typical methods for fabricating and using resist materials. As is explained in that patent, the process typically starts by dissolving a suitable polymer in a solvent. A thin polymer film is then formed on a substrate by a process such as, for example, spinning a drop of the dissolved polymer on the substrate surface and allowing it to dry. The polymer film may then be baked to improve the adhesion and handling characteristics of the film. The next step involves exposing selected portions of the polymer film to radiation, such as light or electron beam radiation, in the range of 5 to 30 kilovolts. This radiation causes scission of the bonds of the polymer. As a result of such scissions, the portions of the polymer film which have been exposed to the radiation may be selectively removed by application of a developer solvent while leaving the unexposed portion of the film still adhered to the substrate.

Poly(dimethacrylimide) and poly(N-alkyl dimethacrylimides) have been reported in the literature. See Makromol. Chem. 96 227 (1966); Chem. Abst. 65, 10680 (1966); and Makromol. Chem. 88, 133 (1965); Chem. Abst. 6186 (1962); and German Patent 1,113,309. The art, however, makes no mention whatsoever of any resist use of these materials.

Polymers of methyl methacrylate, methacrylic acid, its anhydride, and copolymers thereof, have previously been known as positive electron beam resists. The materials of the present invention, however, have unexpectedly been found to have superior properties for use as positive lithographic resists which are very sensitive to both electron beam and light irradiation.

SUMMARY OF THE INVENTION

According to the present invention, images are formed using as a positive resist a thin film of a polymeric composition comprising dimethylglutarimide units, having the structure

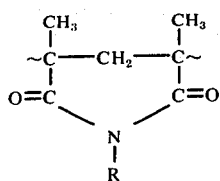

wherein R is H, $CH_3$ or $C_2H_5$.

The dimethylglutarimide unit containing polymers of the present invention make possible resists simultaneously having very fine spatial resolution capabilities, high glass transition temperatures and high temperature stability, up to 300°C. Still an additional advantage is that the homopolymers and copolymers of the present invention generate far fewer bubbles than found in the non-modified polymers. They are very suitable for use as lithographic resists in the positive mode and are sensitive to both electron beam and light radiation, for example, light of about 2537 A in wave length. The resists are particularly useful in micro circuitry processings.

In one preferred embodiment of the present invention, the resist film is formed in situ by heating in the presence of gaseous ammonia, methyl amine or ethyl amine, a resist film containing dimethacrylic acid units. Dimethacrylic acid units have the structure

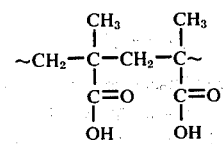

When the dimethacrylic acid containing polymer is treated with ammonia or an amine in the vapor state, the corresponding imide is formed in situ. Such an in situ method has the advantage of not requiring film casting, an advantage particularly useful in regard to the dimethylglutarimide polymers of the present invention since they have very little solubility in common nonreacting solvents. Another advantage of the in situ preparation is that it is possible to combine the heating with ammonia vapor with the conventional pre-baking process to which many polymer resist films are subjected before treatment with developer solvents in order to eliminate cracking.

For use in the process in the present invention, resist films of polydimethacrylimide are particularly suitable. Other suitable polymers include copolymers of dimethylacrylimide with othr vinyl type monomers, for example, styrene. One particularly suitable vinyl type monomer for copolymerization is methyl methacrylate.

The following examples are given solely for the purposes of illustration and are not to be considered as limitations on the invention, many variations of which are possible without departing from the spirit or scope thereof.

EXAMPLE I

Poly(dimethacrylimide)

Thin films (a few microns thick) of poly(methacrylic acid) were cast from an 8% (w/v) 2-methoxy ethanol solution on a silicon wafer, and on a sodium chloride plate. They were placed in a vessel which was then pumped down to $10^{-3}$ torr to remove traces of the solvent. After introducing ammonia to 15 cmHg, the entire vessel was placed in an oil bath held at 200°C for 1 hr. and then again pumped down to $10^{-3}$ torr at room temperature. The polymer film thus treated on a silicon wafer was used for electron beam exposure, while the polymer film on the sodium chloride plate was used for IR measurement. The polymer film thus obtained has exactly the same IR spectrum as the one reported in the literature. The reported method for the preparation of poly(dimethacrylimide), however, requires multiple processes including a high pressure operation, while the present method is a single one step process.

EXAMPLE II

Poly(N-methyl dimethacrylimide)

The same procedure described above for poly(dimethacrylimide) in Example I was used except monomethyl amine or dimethyl amine replaced ammonia. The polymer film thus obtained has exactly the same IR spectrum as that reported in the literature for poly(N-methyl dimethacrylimide).

EXAMPLE III

The same procedure described above for Example I was used except monoethyl amine replaced ammonia. In this way poly(N-ethyl dimethacrylimide) was obtained.

EXAMPLE IV

For all poly(dimethacrylimide) preparations, poly(methacrylic acid) can be replaced by poly(methacrylic anhydride), and the process described above carried out. All these poly(dimethacrylimides) have completely different IR spectra from poly(methacrylic anhydride), which would have been formed under these conditions in absence of ammonia or amines.

EXAMPLE V

Copolymers of dimethacrylimides and methyl methacrylate

As a typical example, a copolymer of methyl methacrylate and methacrylic acid with the molar ratio 65/35 has been converted to a copolymer of dimethacrylimide and methyl methacrylate according to the same procedure described in Example I. This particular copolymer has never been reported in the literature.

EXAMPLE VI

Electron Beam Exposure

About one micron thick films of poly(dimethacrylimide), poly(N-methyl dimethacrylimide), and poly(N-ethyl dimethacrylimide) were exposed to scanning electron beam at 23 KeV with a dosage of $10^{-5}$ Coulomb/cm$^2$. All these thin polymer films showed positive electron beam characteristics, that is, degradation of the film where the electron beam scanned, after development in 2-ethoxy ethanol (ethyl cellosolve) or in an aqueous ethanol. For comparison purposes, films of the same thickness of the copolymer of methacrylic acid and methyl methacrylate and their ammonia modified copolymers were exposed to 23 KeV scanning electron beam at a dosage of $10^{-5}$ Coulomb/cm$^2$. These films were developed in 2-ethoxy ethyl acetate. The ammonia and amine modified films gave clearer and sharper images than the non-modified copolymer.

EXAMPLE VII

Photochemical degradations

In order to ascertain the mechanism of the degradation of poly(dimethacrylimides) and to explore their applicability as photoresists for contact-mask lithography, the photochemical degradation of poly(dimethacrylimides) was studied at −100°C. Both poly(N-methyl dimethacrylimide) and poly(N-ethyl dimethacrylimide) gave new IR peaks at 2338 cm$^{-1}$ (Me-N=C=O, Et-N=C=O) and at 2135 cm$^{-1}$ (CH$_3$C(=C=O)CH$_2$~) at −100°C. This clearly indicates main chain scission. For comparison purposes, the photochemical degradation of prebaked PMAA at −100°C was carried out. From poly(dimethacrylimide), formation of HN=C=O was confirmed, but its corresponding ketene was only faintly observed at 2120 cm$^{-1}$ probably due to its fast photo-induced intramolecular ring formation reaction. This is supported in practice by its positive resists characteristics.

What is claimed is:

1. A process for forming an image with a positive resist, said process comprising the steps of:
   1. forming on a substrate a film of a composition comprising a polymer containing the structural unit

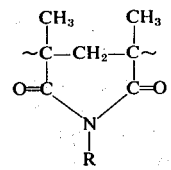

wherein R is H, CH$_3$ or C$_2$H$_5$,
   2. exposing said film in a predetermined pattern to radiation,
   3. removing the radiation exposed portion of said film with a solvent.

2. A process as claimed in claim 1 wherein the radiation is by means of an electron beam.

3. A process as claimed in claim 1 wherein the radiation is by means of light.

4. A process as claimed in claim 1 wherein R is hydrogen.

5. A process as claimed in claim 1 wherein R is CH$_3$.

6. A process as claimed in claim 1 wherein R is C$_2$H$_5$.

7. A process as claimed in claim 1 wherein the polymer is poly(dimethacrylimide).

8. A process as claimed in claim 1 wherein the polymer is a copolymer of dimethacrylimide and another vinyl type monomer.

9. A process as claimed in claim 1 wherein the polymer is a copolymer of dimethacrylimide and methyl methacrylate.

10. A process for the in situ preparation of a resist film, said process comprising heating a resist film containing dimethacrylic structures with ammonia, methyl amine or ethyl amine.

* * * * *